United States Patent
Li et al.

(10) Patent No.: US 11,348,988 B2
(45) Date of Patent: May 31, 2022

(54) DISPLAY PANEL, DISPLAY DEVICE AND DETECTION COMPENSATION METHOD OF DISPLAY PANEL

(71) Applicant: WuHan TianMa Micro-electronics CO., LTD., Wuhan (CN)

(72) Inventors: Tianrui Li, Wuhan (CN); Jingxiong Zhou, Wuhan (CN); Guang Wang, Wuhan (CN); Ruiyuan Zhou, Wuhan (CN)

(73) Assignee: WUHAN TIANMA MICRO-ELECTRONICS CO., LTD, Wuhan (CN)

( * ) Notice: Subject to any disclaimer, the term of this patent is extended or adjusted under 35 U.S.C. 154(b) by 190 days.

(21) Appl. No.: 16/840,164

(22) Filed: Apr. 3, 2020

(65) Prior Publication Data
US 2021/0193771 A1    Jun. 24, 2021

(30) Foreign Application Priority Data
Dec. 24, 2019    (CN) .......................... 201911348802.0

(51) Int. Cl.
*G09G 3/36*     (2006.01)
*H01L 27/32*    (2006.01)
(Continued)

(52) U.S. Cl.
CPC ....... *H01L 27/3276* (2013.01); *G09G 3/3266* (2013.01); *G09G 3/3275* (2013.01);
(Continued)

(58) Field of Classification Search
CPC .......... G09G 3/32; G09G 3/3233; G09G 3/30; G09G 2300/04; G09G 2300/0426; G09G 3/3208
See application file for complete search history.

(56) References Cited

U.S. PATENT DOCUMENTS

2006/0022305 A1\*    2/2006    Yamashita ........... G09G 3/2014
                                                                         257/565
2007/0164954 A1\*    7/2007    Yang ....................... H01L 33/52
                                                                          345/88
(Continued)

FOREIGN PATENT DOCUMENTS

CN    101251978 A   \*   8/2008    ........... G09G 3/3233
CN    101976546 A       2/2011
(Continued)

OTHER PUBLICATIONS

First Chinese Office Action, dated Sep. 25, 2020, issued in corresponding Chinese Application No. 201911348802.0, filed Dec. 24, 2019, 18 pages.

*Primary Examiner* — Mary A Wilczewski
*Assistant Examiner* — Tsz K Chiu
(74) *Attorney, Agent, or Firm* — Christensen O'Connor Johnson Kindness PLLC

(57) ABSTRACT

Display panel, display device and detection compensation method of display panel are disclosed herein. In one embodiment, a display panel includes: display pixels arranged in M rows and N columns and provided in a display area, where both M and N are both positive integers; first power supply lines provided in the display area; and an integrated circuit, a switch circuit and a voltage stabilization transistor provided in a border area. One row of display pixels is electrically connected to one first power supply line. The first power supply lines are electrically connected to a first pin of the integrated circuit. A detection pin of the integrated circuit is electrically connected to the switch circuit. The voltage stabilization transistor includes: a control electrode electrically connected to the second pin, a first electrode electrically connected to the detection pin, and a second electrode electrically connected to one row of display pixels.

20 Claims, 11 Drawing Sheets

(51) Int. Cl.
*G09G 3/3266* (2016.01)
*G09G 3/3275* (2016.01)

(52) U.S. Cl.
CPC . *H01L 27/3265* (2013.01); *G09G 2300/0413* (2013.01); *G09G 2300/0842* (2013.01)

(56) References Cited

U.S. PATENT DOCUMENTS

| | | | | |
|---|---|---|---|---|
| 2008/0198103 | A1* | 8/2008 | Toyomura | G09G 3/325 345/77 |
| 2010/0220079 | A1* | 9/2010 | Bang | G09G 3/3696 345/204 |
| 2012/0026146 | A1* | 2/2012 | Kim | G09G 3/3233 345/78 |
| 2014/0001368 | A1* | 1/2014 | Huang | G01T 1/24 250/370.09 |
| 2014/0043274 | A1* | 2/2014 | Yao | G06F 3/04164 345/173 |
| 2014/0176402 | A1* | 6/2014 | Lee | G09G 3/3233 345/77 |
| 2014/0176884 | A1* | 6/2014 | Yang | G02F 1/1339 349/106 |
| 2015/0332632 | A1* | 11/2015 | Nakata | G09G 3/3607 345/690 |
| 2016/0155385 | A1* | 6/2016 | Yang | G06F 3/042 345/174 |
| 2017/0090663 | A1* | 3/2017 | Tang | G06F 3/0412 |
| 2017/0160851 | A1* | 6/2017 | Jin | G09G 3/3648 |
| 2017/0168605 | A1* | 6/2017 | Xi | G06F 3/04166 |
| 2017/0270860 | A1* | 9/2017 | Wang | G09G 3/3258 |
| 2018/0284551 | A1* | 10/2018 | Shim | G09G 3/3266 |
| 2021/0375213 | A1* | 12/2021 | Gao | G09G 3/3291 |
| 2022/0068212 | A1* | 3/2022 | Yao | G11C 19/28 |

FOREIGN PATENT DOCUMENTS

| | | | |
|---|---|---|---|
| CN | 106128384 A | 11/2016 | |
| CN | 106531067 A | 3/2017 | |
| CN | 107154239 A | 9/2017 | |
| GB | 2488179 A * | 8/2012 | .......... G09G 3/3241 |
| WO | WO-2012114059 A2 * | 8/2012 | .......... G09G 3/3241 |

* cited by examiner

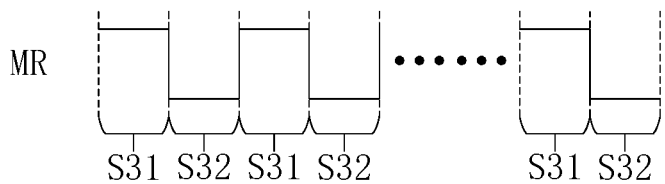

FIG. 11

| The detection pin PIN0 of the integrated circuit IC sequentially detects, through the switch circuit SW, the potentials of the respective first power supply lines PL connected to the 1st to Mth rows of display pixels PX | S31 |

↓

| The second pin PIN2 of the integrated circuit IC controls the voltage stabilization transistor MR to be turned on, and the detection pin PIN0 of the integrated circuit IC obtains, through the voltage stabilization transistor MR, the potential of the first power supply line PL connected to the 1st row of display pixels PX | S32 |

| The detection pin PIN0 of the integrated circuit IC sequentially detects, through the switch circuit SW, the potentials of the respective first power supply lines PL connected to the Mth to 1st rows of display pixels PX | S31 |

↓

| The second pin PIN2 of the integrated circuit IC controls the voltage stabilization transistor MR to be turned on, and the detection pin PIN0 of the integrated circuit IC obtains, through the voltage stabilization transistor MR, the potential of the first power supply line PL connected to the Mth row of display pixels PX | S32 |

DISPLAY PANEL, DISPLAY DEVICE AND DETECTION COMPENSATION METHOD OF DISPLAY PANEL

CROSS-REFERENCE TO RELATED APPLICATIONS

The present application claims the benefit of priority to Chinese Patent Application No. 201911348802.0, filed on Dec. 24, 2019, the content of which is incorporated herein by reference in its entirety.

TECHNICAL FIELD

The present disclosure relates to the field of display technologies, and in particular, to a display panel, a display device, and a detection compensation method of the display panel.

BACKGROUND

In the field of display technologies, an organic light-emitting display panel has been widely recognized as a third-generation display technology after a liquid crystal display panel due to its advantages such as lightness, active luminescence, fast response, wide viewing angles, rich colors, high brightnesses, low power consumption, and high/low temperature resistance.

For the display panel in the related art, a potential of a power supply line (PVDD) is transmitted to a column of organic light-emitting elements (OLEDs). A voltage drop of the power supply line (PVDD) causes the potential of the power supply line (PVDD) to be uneven. An integrated circuit can detect the potential of the power supply line (PVDD), so that a display brightness of the organic light-emitting element (OLED) can be compensated for. However, the detection of the potential of the power supply line (PVDD) by the integrated circuit is not accurate with the conventional technologies.

SUMMARY

In order to solve the above technical problems, the present disclosure provides a display panel, a display device, and a detection compensation method for a display panel.

In a first aspect, the present disclosure provides a display panel having a display area and a border area. The display panel includes: display pixels arranged in M rows and N columns and provided in the display area, where both M and N are positive integers; first power supply lines provided in the display area; an integrated circuit provided in the border area and including a first pin, a detection pin and a second pin; at least one switch circuit provided in the border area; and at least one voltage stabilization transistor provided in the border area. One of the M rows are electrically connected to one of the first power supply lines, the first power supply lines are electrically connected to the first pin of the integrated circuit, the detection pin of the integrated circuit is electrically connected to the at least one switch circuit, the at least one switch circuit is electrically connected to any one of the M rows of the display pixels, and each of the at least one voltage stabilization transistor includes: a control electrode electrically connected to the second pin of the integrated circuit, a first electrode electrically connected to the detection pin of the integrated circuit, and a second electrode electrically connected to one of the M rows of the display pixels.

In a second aspect, the present disclosure provides a display device including the display panel described above.

In a third aspect, the present disclosure provides a detection compensation method of a display panel, and the display panel having a display area and a border area. The display panel includes: display pixels arranged in M rows and N columns and provided in the display area, where both M and N are positive integers; first power supply lines provided in the display area; an integrated circuit provided in the border area and including a first pin, a detection pin and a second pin; at least one switch circuit provided in the border area; and at least one voltage stabilization transistor provided in the border area. One of the M rows is electrically connected to one of the first power supply lines, the first power supply lines are electrically connected to the first pin of the integrated circuit, the detection pin of the integrated circuit is electrically connected to the at least one switch circuit, the at least one switch circuit is electrically connected to any one of the M rows of the display pixels, and each of the at least one voltage stabilization transistor includes: a control electrode electrically connected to the second pin of the integrated circuit, a first electrode electrically connected to the detection pin of the integrated circuit, and a second electrode electrically connected to one of the M rows of the display pixels. The detection compensation method of the display panel includes: in a first stage, sequentially detecting, by the detection pin of the integrated circuit through the at least one switch circuit, a potential of the first power supply lines connected to any one of the M rows of the display pixels; and in a second stage, controlling, by the second pin of the integrated circuit, the at least one voltage stabilization transistor to be turned on; and obtaining, by the detection pin of the integrated circuit through the at least one voltage stabilization transistor, a potential of one of the first power supply lines connected to one of the M rows of the display pixels.

In the present disclosure, the control electrode of the voltage stabilization transistor is electrically connected to the second pin of the integrated circuit, the first electrode of the voltage stabilization transistor is electrically connected to the detection pin of the integrated circuit, and the second electrode of the voltage stabilization transistor is electrically connected to the first power supply line connected to one row of display pixels. Within any one frame, the second pin of the integrated circuit controls the voltage stabilization transistor to be turned off. During a period between two consecutive frames, the second pin of the integrated circuit controls the voltage stabilization transistor to be turned on. At this time, the detection pin of the integrated circuit obtains the first power supply potential of one row of display pixels through the voltage stabilization transistor. The first power supply potential of one row of display pixels is approximately equal to or exactly equal to the first power supply potential of each of the first several rows (for example a $1^{st}$ row) of display pixels, or is approximately equal to or exactly equal to the first power supply potential of each of the last several rows (for example an $M^{th}$ row) of display pixels. At the same time, the voltage stabilization transistor avoids floating of the detection pin of the integrated circuit. The first power supply potential of one row of display pixels is larger than a floating potential. During a period between two consecutive frames, a signal of the detection pin of the integrated circuit is approximately equal to or exactly equal to the first power supply potential of each of the first several rows (for example the $1^{st}$ row) of display pixels, or is approximately equal to or exactly equal to the first power supply potential of each of the last several rows (for example the $M^{th}$ row) of display pixels. At the beginning of the latter frame of two consecutive frames, the detection pin of the integrated circuit detects, through the switch circuit, the first power supply potential of each of the first several rows (for example the $1^{st}$ row) of display pixels, or the first power supply potential PVDD of each of the last several rows (for example the $M^{th}$ row) of display pixels. At this time, the signal of the detection pin of the integrated circuit is immediately turned to be the first power supply potential of each of the first several rows (for example the $1^{st}$ row) of display pixels, or the first power supply potential of each of the last several rows (for example the $M^{th}$ row) of display pixels. At the same time, the integrated circuit accurately detects the first power supply potential of each of the first several rows (for example the $1^{st}$ row) of display pixels, or the first power supply potential of each of the last several rows (for example the $M^{th}$ row) of display pixels. Therefore, the voltage stabilization transistor can improve a detection accuracy of the integrated circuit.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art.

FIG. 11 is a schematic time sequence diagram of a detection compensation method of a display panel according to an embodiment of the present disclosure;

FIG. 12 is a schematic flowchart of a detection compensation method of another display panel according to an embodiment of the present disclosure;

FIG. 13 is a schematic flowchart of a detection compensation method of another display panel according to an embodiment of the present disclosure;

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although the device may be described using the terms of "first", "second", etc., in the embodiments of the present disclosure, the device will not be limited to these terms. These terms are merely used to distinguish devices from one another. For example, without departing from the scope of the embodiments of the present disclosure, a first device may also be referred to as a second device, and similarly, a second device may also be referred to as a first device.

Embodiments of the present disclosure provide a display panel, a display device, and a detection compensation method of a display panel.

Figure 1:
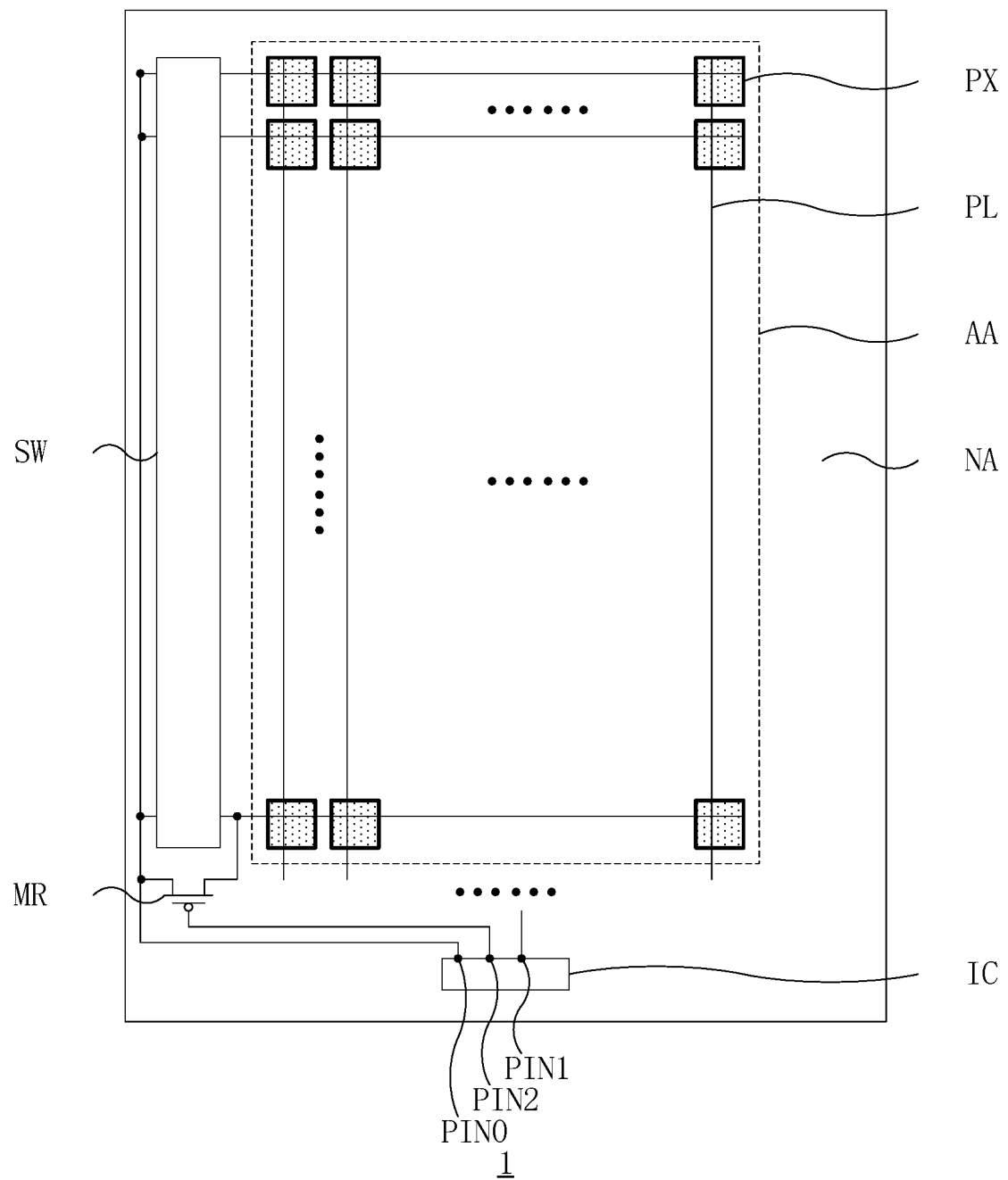
FIG. 1 is a schematic diagram of a structure of a display panel according to an embodiment of the present disclosure.

FIG. 1 is a schematic diagram of a structure of a display panel according to an embodiment of the present disclosure. As shown in FIG. 1, the display panel 1 has a display area AA and a border area NA. The display area AA is provided with display pixels PX arranged in M rows and N columns, and first power supply lines PL. Here, both M and N are positive integers. The border area NA is provided with an integrated circuit IC, a switch circuit SW and a voltage stabilization transistor MR. One column of display pixels PX is electrically connected to one first power supply line PL, and the first power supply line PL is electrically connected to a first pin PIN1 of the integrated circuit IC. A detection pin PIN0 of the integrated circuit IC is electrically connected to the switch circuit SW, and the switch circuit SW is electrically connected to any one row of display pixels PX. The voltage stabilization transistor MR includes a control electrode electrically connected to a second pin PIN2 of the integrated circuit IC, a first electrode electrically connected to the detection pin PIN0 of the integrated circuit IC, and a second electrode electrically connected to one row of display pixels PX.

Here, the border area NA surrounds the display area AA. A number of rows and columns of display pixels PX in the display area AA is not limited herein.

One column of display pixels PX is electrically connected to one first power supply line PL, and the first power supply line PL is electrically connected to the first pin PIN1 of the integrated circuit IC. The first pin PIN1 of the integrated circuit IC transmits a first power supply potential PVDD to one column of display pixels PX through one first power supply line PL. The detection pin PIN0 of the integrated circuit IC is electrically connected to the switch circuit SW, and the switch circuit SW is electrically connected to any one row of display pixels PX. The detection pin PIN0 of the integrated circuit IC detects the first power supply potential PVDD of any one row of display pixels PX through the switch circuit SW. Within any one frame, a $1^{st}$ row of display pixels PX to an $M^{th}$ row of display pixels PX, or an $M^{th}$ row of display pixels PX to a $1^{st}$ row of display pixels PX are sequentially driven to emit light. Meanwhile, the detection pin PIN0 of the integrated circuit IC sequentially detects the first power supply potential PVDD of the $1^{st}$ row of display pixels PX to the $M^{th}$ row of display pixels PX, or the $M^{th}$ row of display pixels PX to the $1^{st}$ row of display pixels PX through the switch circuit SW.

The control electrode of the voltage stabilization transistor MR is its gate electrode. The first and second electrodes of the voltage stabilization transistor MR are its source and drain electrodes or its drain and source electrodes. The same applies for the control electrodes, the first electrodes, and the second electrodes of other transistors.

The control electrode of the voltage stabilization transistor MR is electrically connected to the second pin PIN2 of the integrated circuit IC, the first electrode of the voltage stabilization transistor MR is electrically connected to the detection pin PIN0 of the integrated circuit IC, and the second electrode of the voltage stabilization transistor MR is electrically connected to the first power supply lines PL connected to one row of display pixels PX. Within any one frame, the second pin PIN2 of the integrated circuit IC controls the voltage stabilization transistor MR to be turned off. During a period between two consecutive frames, the second pin PIN2 of the integrated circuit IC controls the voltage stabilization transistor MR to be turned on. At this time, the detection pin PIN0 of the integrated circuit IC obtains the first power supply potential PVDD of one row of display pixels PX through the voltage stabilization transistor MR. The first power supply potential PVDD of one row of display pixels PX is approximately equal to or exactly equal to the first power supply potential PVDD of each of the first several rows (for example a $1^{st}$ row) of display pixels PX, or is approximately equal to or exactly equal to the first power supply potential PVDD of each of the last several rows (for example an $M^{th}$ row) of display pixels PX. At the same time, the voltage stabilization transistor MR avoids floating of the detection pin PIN0 of the integrated circuit IC. The first power supply potential PVDD of one row of display pixels PX is larger than a floating potential. During a period between two consecutive frames, a signal of the detection pin PIN0 of the integrated circuit IC is approximately equal to or exactly equal to the first power supply potential PVDD of each of the first several rows (for example the $1^{st}$ row) of display pixels PX, or is approximately equal to or exactly equal to the first power supply potential PVDD of each of the last several rows (for example the $M^{th}$ row) of display pixels PX. At the beginning of the latter frame of two consecutive frames, the detection pin PIN0 of the integrated circuit IC detects, through the switch circuit SW, the first power supply potential PVDD of each of the first several rows (for example the $1^{st}$ row) of display pixels PX, or the first power supply potential PVDD of each of the last several rows (for example the $M^{th}$ row) of display pixels PX. At this time, the signal of the detection pin PIN0 of the integrated circuit IC is immediately turned to be the first power supply potential PVDD of each of the first several rows (for example the $1^{st}$ row) of display pixels PX, or the first power supply potential PVDD of each of the last several rows (for example the $M^{th}$ row) of display pixels PX. At the same time, the integrated circuit IC accurately detects the first power supply potential PVDD of each of the first several rows (for example the $1^{st}$ row) of display pixels PX, or the first power supply potential PVDD of each of the last several rows (for example the $M^{th}$ row) of display pixels PX. Thereby, the voltage stabilization transistor MR improves a detection accuracy of the integrated circuit IC.

Figure 2:
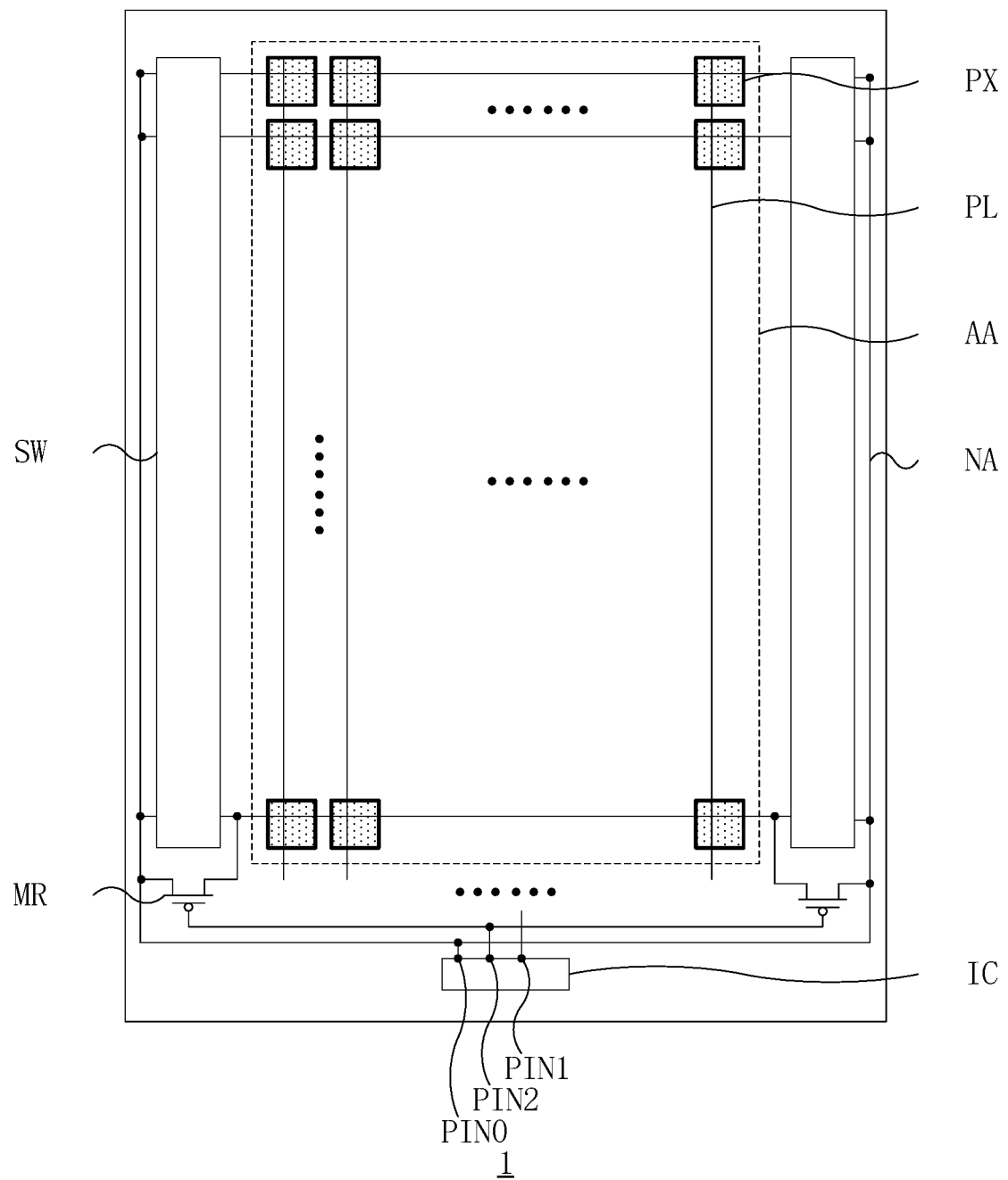
FIG. 2 is a schematic diagram of a structure of another display panel according to an embodiment of the present disclosure.

FIG. 2 is a schematic diagram of a structure of another display panel according to an embodiment of the present disclosure As shown in FIG. 2, for two voltage stabilization transistors MR, the control electrodes of the two voltage stabilization transistors MR are electrically connected to the second pin PIN2 of the integrated circuit IC, the first electrodes of the two voltage stabilization transistors MR are electrically connected to the detection pin PIN0 of the integrated circuit IC, and the second electrode of one of the two voltage stabilization transistors MR is electrically connected to a first end of one row of display pixels PX, while the second electrode of the other one of the two voltage stabilization transistors MR is electrically connected to a second end of this row of display pixels PX. Here, the first end and the second end of one row of display pixels PX are opposite from each other.

The control electrodes of the two voltage stabilization transistors MR are electrically connected to the second pin PIN2 of the integrated circuit IC. Within any one frame, the second pin PIN2 of the integrated circuit IC controls the two voltage stabilization transistors MR to be turned off. During a period between two consecutive frames, the second pin PIN2 of the integrated circuit IC controls the two voltage stabilization transistors MR to be turned on. The first electrodes of the two voltage stabilization transistors MR are electrically connected to the detection pin PIN0 of the integrated circuit IC, and the second electrode of one of the two voltage stabilization transistors MR is electrically connected to the first power supply line PL at the first end of one row of display pixels PX, while the second electrode of the other one of the two voltage stabilization transistors MR is electrically connected the first power supply line PL at the second end of this row of display pixels PX. The first and second ends of one row of display pixels PX are respectively its left end and right end. During a period between two consecutive frames, the second pin PIN2 of the integrated circuit IC obtains the first power supply potential PVDD at the first end of one row of display pixels PX through one voltage stabilization transistor MR, and at the same time, the second pin PIN2 of the integrated circuit IC obtains the first power supply potential PVDD at the second end of this row of display pixels PX through the other one voltage stabilization transistor MR. The second pin PIN2 of the integrated circuit IC obtains the first power supply potential PVDD of this row of display pixels PX through any one of the two voltage stabilization transistors MR. If one of the two voltage stabilization transistors MR is damaged while the other one of the two voltage stabilization transistors MR is not damaged, the second pin PIN2 of the integrated circuit IC can still obtain the first power supply potential PVDD of this row of display pixels PX. Therefore, the two voltage stabilization transistors MR can improve reliability of the integrated circuit IC.

As shown in FIG. 1 and FIG. 2, the second electrode of the voltage stabilization transistor MR is electrically connected to the $M^{th}$ row of display pixels PX.

The first electrode of the voltage stabilization transistor MR is electrically connected to the detection pin PIN0 of the integrated circuit IC, and the second electrode of the voltage stabilization transistor MR is electrically connected to the first power supply line PL of the $M^{th}$ row of display pixels PX. During a period between two consecutive frames, the integrated circuit IC is electrically connected to the $M^{th}$ row of display pixels PX through the voltage stabilization transistor MR. The $M^{th}$ row of display pixels PX are located at a bottom of the display area AA. The integrated circuit IC is located at a lower position of the border area NA. A distance between the $M^{th}$ row of display pixels PX and the integrated circuit IC is smaller than a distance between any other row of display pixels PX and the integrated circuit IC. The integrated circuit IC has a short wire for being electrically connected to the $M^{th}$ row of display pixels PX through the voltage stabilization transistor MR. Therefore, it is easy to design a wire for the integrated circuit IC being electrically connected to the $M^{th}$ row of display pixels PX through the voltage stabilization transistor MR.

Figure 3:
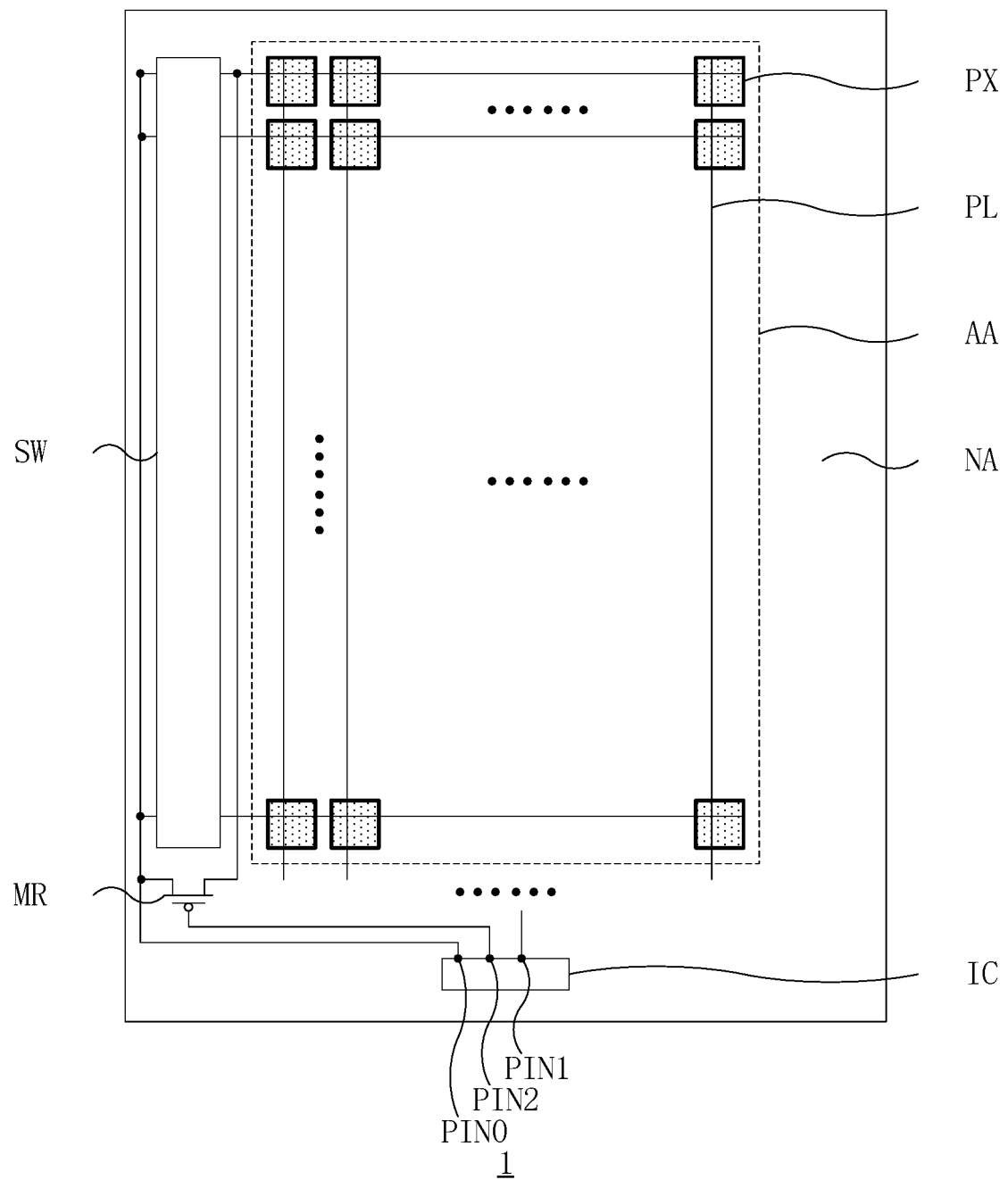
FIG. 3 is a schematic diagram of a structure of another display panel according to an embodiment of the present disclosure.

FIG. 3 is a schematic diagram of a structure of another display panel according to an embodiment of the present disclosure.

As shown in FIG. 3, the second electrode of the voltage stabilization transistor MR is electrically connected to the $1^{st}$ row of display pixels PX.

The first electrode of the voltage stabilization transistor MR is electrically connected to the detection pin PIN0 of the integrated circuit IC, and the second electrode of the voltage stabilization transistor MR is electrically connected to the first power supply line PL of to the $1^{st}$ row of display pixels PX. Within any one frame, the $1^{st}$ row of display pixels PX to the $M^{th}$ row of display pixels PX are sequentially driven to emit light. During a period between two consecutive frames, the detection pin PIN0 of the integrated circuit IC obtains the first power supply potential PVDD of the $1^{st}$ row of display pixels PX through the voltage stabilization transistor MR. At this time, the signal of the detection pin PIN0 of the integrated circuit IC is equal to the first power supply potential PVDD of the $1^{st}$ row of display pixels PX. At the beginning of the latter frame of two consecutive frames, the detection pin PIN0 of the integrated circuit IC detects the first power supply potential PVDD of the $1^{st}$ row of display pixels PX through the switch circuit SW. At this time, the signal of the detection pin PIN0 of the integrated circuit IC remains as the first power supply potential PVDD of the $1^{st}$ row of display pixels PX. The signal of the detection pin PIN0 of the integrated circuit IC does not change from the period between two consecutive frames to the beginning of the latter frame of the two consecutive frames. The integrated circuit IC can more accurately detect the first power supply potential PVDD of the $1^{st}$ row of display pixels PX. Therefore, the voltage stabilization transistor MR can further improve the detection accuracy of the integrated circuit IC.

Figure 4:
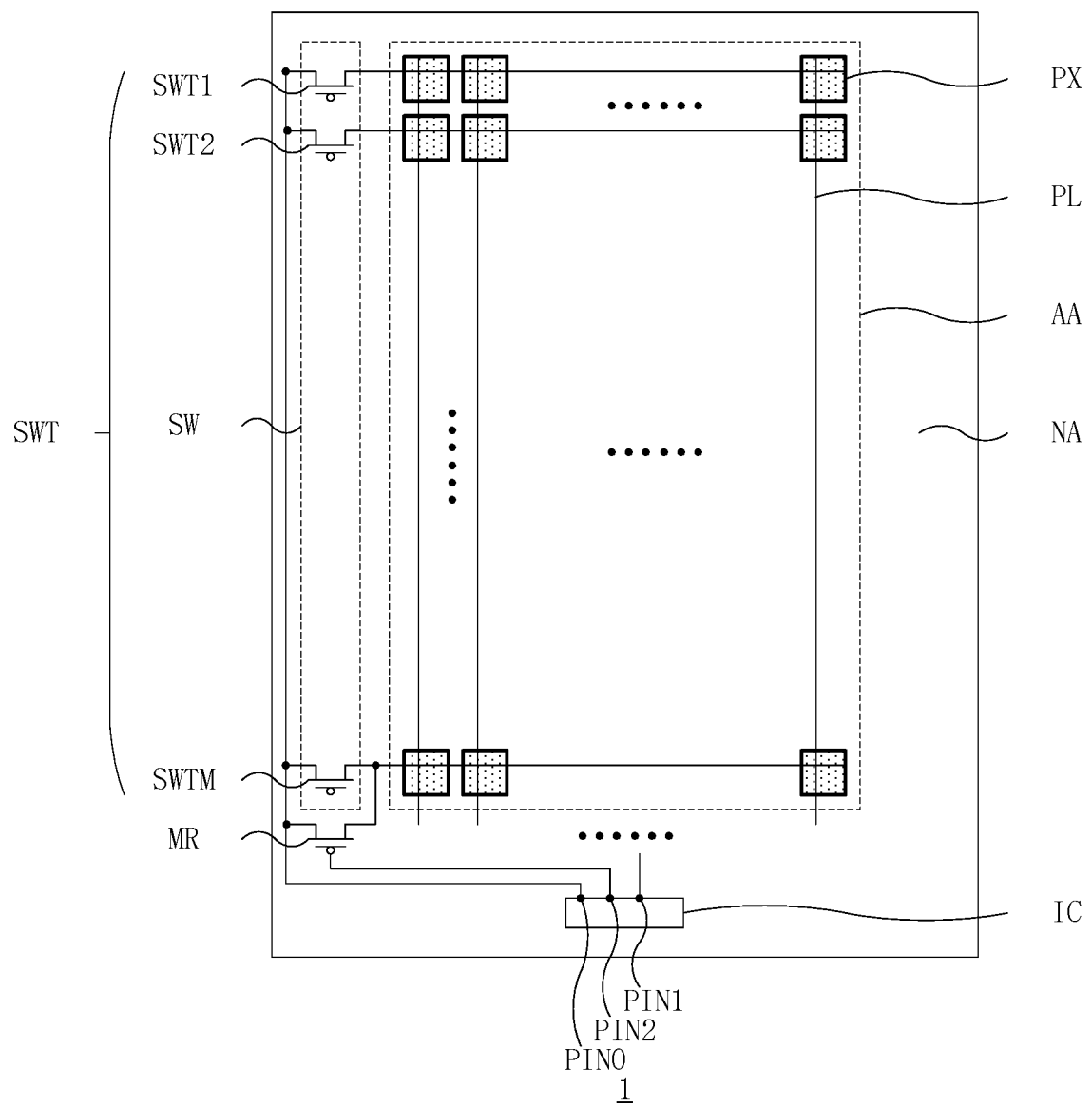
FIG. 4 is a schematic diagram of a structure of another display panel according to an embodiment of the present disclosure.

FIG. 4 is a schematic diagram of a structure of another display panel according to an embodiment of the present disclosure.

As shown in FIG. 4, the switch circuit SW includes M switch transistors SWT. The $X^{th}$ switch transistor SWT is electrically connected to the detection pin PIN0 of the integrated circuit IC and is electrically connected to the $X^{th}$ row of display pixels PX. Here, X is a positive integer smaller than or equal to M.

First electrodes of the M switch transistors SWT are electrically connected to the detection pin PIN0 of the integrated circuit IC. A second electrode of a $1^{st}$ switch transistor SWT1 is electrically connected to the first power supply line PL of the $1^{st}$ row of display pixels PX. A second electrode of a $2^{nd}$ switch transistor SWT2 is electrically connected to the first power supply line PL of the $2^{nd}$ row of display pixels PX. A second electrode of the $M^{th}$ switch transistor SWTM is electrically connected to the first power supply line PL of the $M^{th}$ row of display pixels PX. The detection pin PIN0 of the integrated circuit IC detects the first power supply potential PVDD of the $1^{st}$ row of display pixels PX through the $1^{st}$ switch transistor SWT1. The detection pin PIN0 of the integrated circuit IC detects the first power supply potential PVDD of the $2^{nd}$ row of display pixels PX through the $2^{nd}$ switch transistor SWT2. The detection pin PIN0 of the integrated circuit IC detects the first power supply potential PVDD of the $M^{th}$ row of display pixels PX through the $M^{th}$ switch transistor SWTM, and so on. Within any one frame, the $1^{st}$ to $M^{th}$ switch transistors SWT or the $M^{th}$ to $1^{st}$ switch transistors SWT are sequentially turned on. The detection pin PIN0 of the integrated circuit IC sequentially obtains the first power supply potential PVDD of the $1^{st}$ row of display pixels PX to the $M^{th}$ row of display pixels PX, or the first power supply potential PVDD of the $M^{th}$ row of display pixels PX to the $1^{st}$ row of display pixels PX. A distance between each of the $M^{th}$ row of display pixels PX to the $1^{st}$ row of display pixels PX and the integrated circuit IC is getting longer from bottom to top. Therefore, the integrated circuit IC compensates display brightnesses of the $1^{st}$ row of display pixels PX to the $M^{th}$ row of display pixels PX based on the first power supply potential PVDD of the $M^{th}$ row of display pixels PX to the Pt row of display pixels PX.

Figure 5:
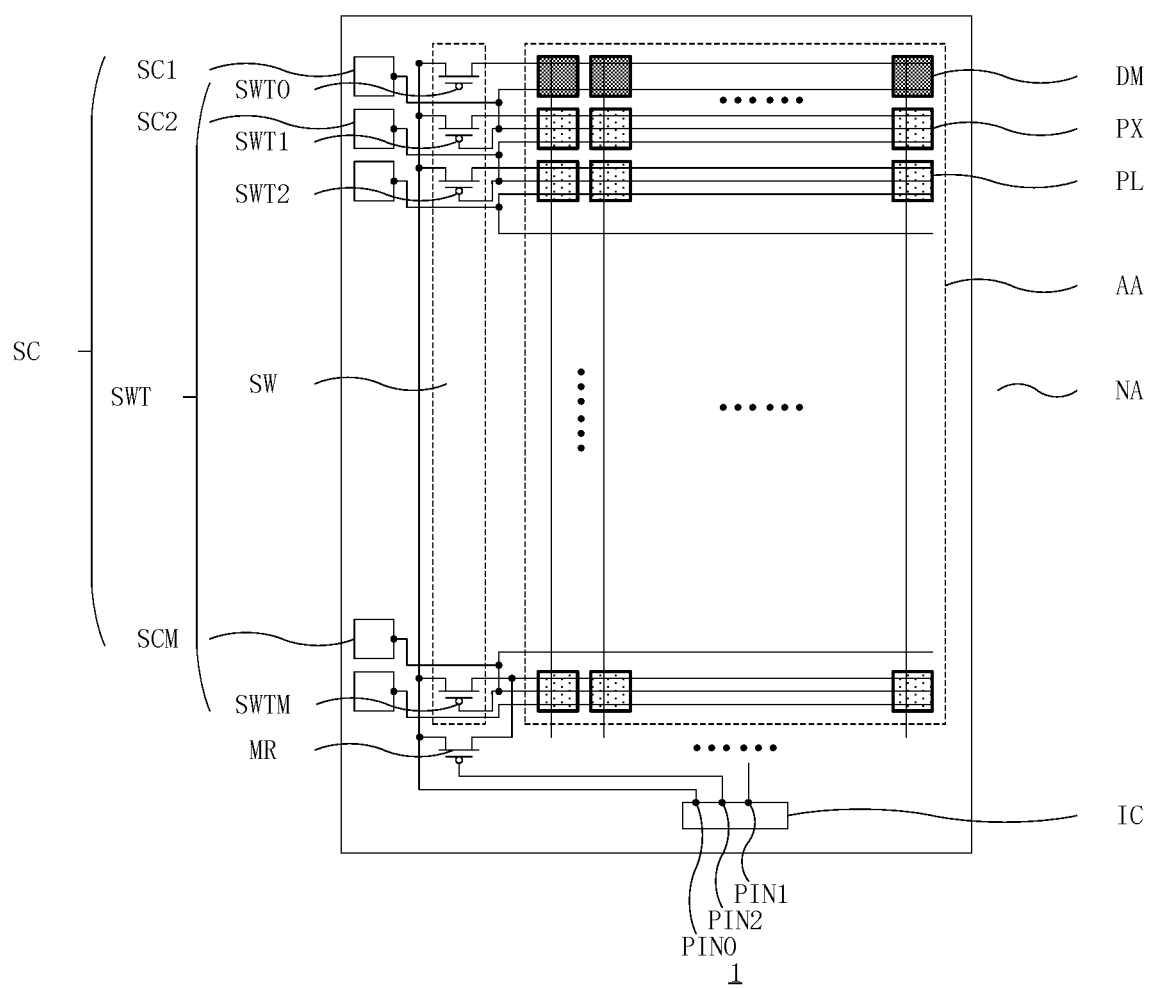
FIG. 5 is a schematic diagram of a structure of another display panel according to an embodiment of the present disclosure.

FIG. 5 is a schematic diagram of a structure of another display panel according to an embodiment of the present disclosure.

As shown in FIG. 5, the display area AA is further provided with one row of dummy pixels DM. The border area NA is further provided with M scanning circuits SC. The scanning circuit SC is electrically connected to the integrated circuit IC. An output terminal of a $1^{st}$ scanning circuit SC1 is electrically connected to the one row of dummy pixels DM and the $1^{st}$ row of display pixels PX. An output terminal of the $X^{th}$ scanning circuit SC other than the $1^{st}$ scanning circuit SC is electrically connected to the $X^{th}$ row of display pixels PX and the $(X-1)^{th}$ row of display pixels PX. The control electrode of the $X^{th}$ switch transistor SWT is electrically connected to the output terminal of the $X^{th}$ scanning circuit SC, the first electrode of the $X^{th}$ switch transistor SWT is electrically connected to the detection pin PIN0 of the integrated circuit IC, and the second electrode of the $X^{th}$ switch transistor SWT is electrically connected to the $X^{th}$ row of display pixels PX.

The scanning circuit SC is electrically connected to the integrated circuit IC. The output terminal of the $1^{st}$ scanning circuit SC1 is electrically connected to the one row of dummy pixels DM and the $1^{st}$ row of display pixels PX. The control electrode of the $1^{st}$ switch transistor SWT1 is electrically connected to the output terminal of the $1^{st}$ scanning circuit SC1, the first electrode of the $1^{st}$ switch transistor SWT1 is electrically connected to the detection pin PIN0 of the integrated circuit IC, and the second electrode of the $1^{st}$ switch transistor SWT1 is electrically connected to the first power supply line PL of the $1^{st}$ row of display pixels PX. An output terminal of the $2^{nd}$ scanning circuit SC2 is electrically connected to the $2^{nd}$ row of display pixels PX and the $1^{st}$ row of display pixels PX. The control electrode of the $2^{nd}$ switch transistor SWT2 is electrically connected to the output terminal of the $2^{nd}$ scanning circuit SC2, the first electrode of the $2^{nd}$ switch transistor SWT2 is electrically connected to the detection pin PIN0 of the integrated circuit IC, and the second electrode of the $2^{nd}$ switch transistor SWT2 is electrically connected to the first power supply line PL of the $2^{nd}$ row of display pixels PX. An output terminal of the $M^{th}$ scanning circuit SCM is electrically connected to the $M^{th}$ row of display pixels PX and the $(M-1)^{th}$ row of display pixels PX. The control electrode of the $M^{th}$ switch transistor SWTM is electrically connected to the output terminal of the $M^{th}$ scanning circuit SCM, the first electrode of the $M^{th}$ switch transistor SWTM is electrically connected to the detection pin PIN0 of the integrated circuit IC, and the second electrode of the $M^{th}$ switch transistor SWTM is electrically connected to the first power supply line PL of the $M^{th}$ row of display pixels PX, and so on.

Figure 6:
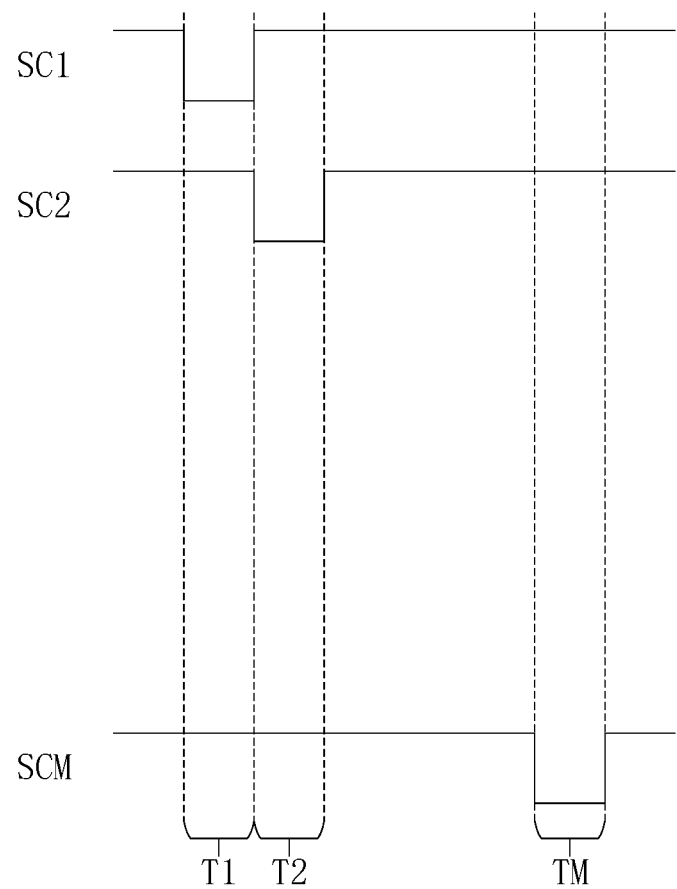
FIG. 6 is a schematic time sequence diagram of a scanning circuit in another display panel according to an embodiment of the present disclosure.

FIG. 6 is a schematic time sequence diagram of a scanning circuit in another display panel according to an embodiment of the present disclosure.

As shown in FIG. 6, the scanning circuit SC includes a first period to an $M^{th}$ period. In the first period T1, the output terminal of the $1^{st}$ scanning circuit SC1 outputs a turn-on signal; in the second period T2, the output terminal of the $2^{nd}$ scanning circuit SC2 outputs a turn-on signal; in the $M^{th}$ period TM, the output terminal of the $M^{th}$ scanning circuit SCM outputs a turn-on signal, and so on.

The circuit herein adopts a P-type transistor. The turn-on signal of the P-type transistor is at a low level.

As shown in FIG. 5 and FIG. 6, in the first period T1, the $1^{st}$ scanning circuit SC1 outputs a turn-on signal to one row of dummy pixels DM and the $1^{st}$ row of display pixels PX; and at the same time, the $1^{st}$ scanning circuit SC1 controls the $1^{st}$ switch transistor SWT1 to be turned on, and the detection pin PIN0 of the integrated circuit IC detects the first power supply potential PVDD of the $1^{st}$ row of display pixels PX. In the second period T2, the $2^{nd}$ scanning circuit SC2 outputs a turn-on signal to the $2^{nd}$ row of display pixels PX and the $1^{st}$ row of display pixels PX; and at the same time, the $2^{nd}$ scanning circuit SC2 controls the $2^{nd}$ switch transistor SWT2 to be turned on, and the detection pin PIN0 of the integrated circuit IC detects the first power supply potential PVDD of the $2^{nd}$ row of display pixels PX. In the $M^{th}$ period TM, the $M^{th}$ scanning circuit SCM outputs a turn-on signal to the $M^{th}$ row of display pixels PX and the $(M-1)^{th}$ row of display pixels PX; and at the same time, the $M^{th}$ scanning circuit SCM controls the $M^{th}$ switch transistor SWTM to be turned on, and the detection pin PIN0 of the integrated circuit IC detects the first power supply potential PVDD of the $M^{th}$ row of display pixels PX, and so on.

In an embodiment, within any one frame, the integrated circuit IC controls the $1^{st}$ to $M^{th}$ scanning circuits SCM to sequentially output a turn-on signal. At this time, the turn-on signals of the $1^{st}$ to $M^{th}$ scanning circuits SCM drive the $1^{st}$ to $M^{th}$ rows of display pixels PX, respectively. At the same time, the $1^{st}$ to $M^{th}$ scanning circuits SCM control the $1^{st}$ to $M^{th}$ switch transistors SWT to be turned on, respectively.

The detection pin PIN0 of the integrated circuit IC sequentially obtains respective first power supply potentials PVDD of the $1^{st}$ to $M^{th}$ rows of display pixels PX. Therefore, the integrated circuit IC compensates the display brightnesses of the $1^{st}$ to $M^{th}$ rows of display pixels PX based on the first power supply potentials PVDD of the $1^{st}$ to $M^{th}$ rows of display pixels PX.

In another embodiment, within any one frame, the integrated circuit IC controls the $M^{th}$ to $1^{st}$ scanning circuits SC1 to sequentially output a turn-on signal. At this time, the turn-on signals of the $M^{th}$ to $1^{st}$ scanning circuits SC1 drive the $M^{th}$ to $1^{st}$ rows of display pixels PX to be turned on, respectively. At the same time, the $M^{th}$ to $1^{st}$ scanning circuits SC1 control the $M^{th}$ to $1^{st}$ switch transistors SWT to be turned on, respectively. The detection pin PIN0 of the integrated circuit IC sequentially obtains the first power supply potentials PVDD of the $M^{th}$ to $1^{st}$ rows of display pixels PX. Therefore, the integrated circuit IC compensates the display brightnesses of the $M^{th}$ to $1^{st}$ rows of display pixels PX based on the first power supply potentials PVDD of the $M^{th}$ to $1^{st}$ rows of display pixels PX.

Figure 7:
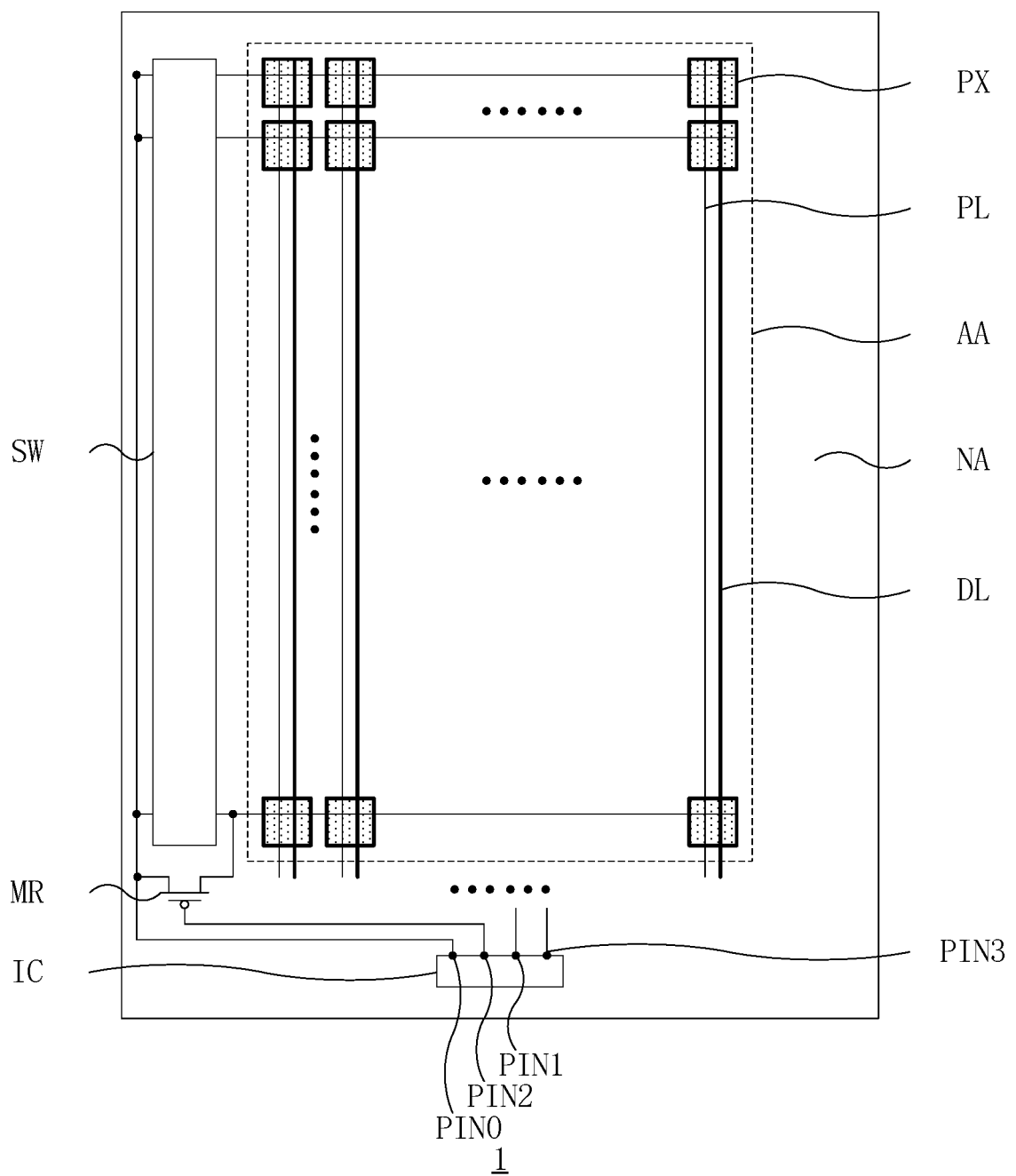
FIG. 7 is a schematic diagram of a structure of another display panel according to an embodiment of the present disclosure.

FIG. 7 is a schematic diagram of a structure of another display panel according to an embodiment of the present disclosure.

As shown in FIG. 7, the display area AA is provided with data lines DL. One data line DL is electrically connected to one column of display pixels PX. The data lines DL are electrically connected to a third pin PIN3 of the integrated circuit IC.

One column of display pixels PX is electrically connected to one first power supply line PL, and the first power supply line PL is electrically connected to the first pin PIN1 of the integrated circuit IC. One column of display pixels PX is electrically connected to one data line DL, and the data line DL is electrically connected to the third pin PIN3 of the integrated circuit IC. The first pin PIN1 of the integrated circuit IC transmits the first power supply potential PVDD to the display pixel PX through the first power supply line PL. The third pin PIN3 of the integrated circuit IC transmits the data potential DATA to the display pixels PX through the data line DL. The first power supply potential PVDD and the data potential DATA are used to drive the display pixels PX to emit light.

Figure 8:
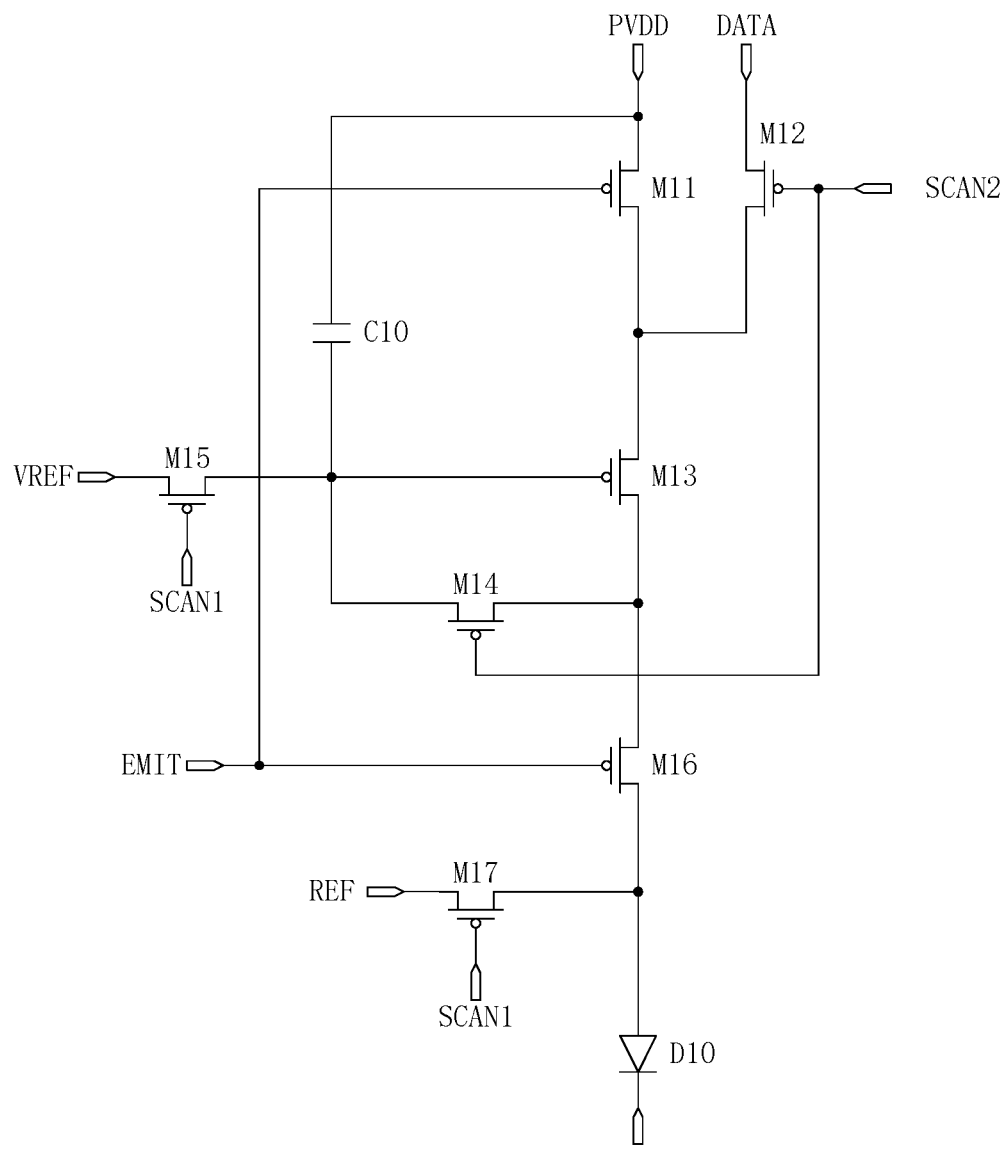
FIG. 8 is a schematic circuit diagram of a display pixel in another display panel according to an embodiment of the present disclosure.

FIG. 8 is a schematic circuit diagram of a display pixel in another display panel according to an embodiment of the present disclosure.

As shown in FIG. 8, the display pixel PX includes a first transistor M11, a second transistor M12, a third transistor M13, a fourth transistor M14, a fifth transistor M15, a sixth transistor M16, a seventh transistor M17, a storage capacitor C10, and an organic light-emitting element D10. Here, each transistor includes a control electrode, a first electrode and a second electrode. The control electrode of the fifth transistor M15 and the control electrode of the seventh transistor M17 are electrically connected to a first scanning signal SCAN1. The first electrode of the fifth transistor M15 is electrically connected to the control electrode of the third transistor M13. The first electrode of the seventh transistor M17 is electrically connected to the organic light-emitting element D10. The second electrode of the fifth transistor M15 and the second electrode of the seventh transistor M17 are electrically connected to a reference potential VREF. The control electrode of the second transistor M12 and the control electrode of the fourth transistor M14 are electrically connected to a second scanning signal SCAN2. The first electrode of the second transistor M12 is electrically connected to the first electrode of the third transistor M13. The second electrode of the second transistor M12 is electrically connected to the data potential DATA. The first electrode of the fourth transistor M14 is electrically connected to the control electrode of the third transistor M13. The second electrode of the fourth transistor M14 is electrically connected to the second electrode of the third transistor M13. The control electrode of the first transistor M11 and the control electrode of the sixth transistor M16 are electrically connected to a transmission signal EMIT. The first electrode of the first transistor M11 is electrically connected to the first electrode of the third transistor M13. The second electrode of the first transistor M11 is electrically connected to the first power supply potential PVDD. The first electrode of the sixth transistor M16 is electrically connected to the second electrode of the third transistor M13. The second electrode of the sixth transistor M16 is electrically connected to the organic light-emitting element D10. The storage capacitor C10 includes a first electrode electrically connected to the control electrode of the third transistor M13, and a second electrode electrically connected to the first power supply potential PVDD.

Here, a driving current of the third transistor M13 is $I_D$. A structural parameter of the third transistor M13 is K. The first power supply potential PVDD is $V_{PVDD}$. The data potential DATA is $V_{DATA}$. These parameters satisfy a relation of $I_D=K(V_{PVDD}-V_{DATA})$. The first power supply potential PVDD and the data potential DATA determine the driving current of the third transistor M13, and the driving current of the third transistor M13 drives the organic light-emitting element D10 to emit light.

As shown in FIG. 6 and FIG. 7, a signal of the third pin PIN3 of the integrated circuit IC is adjusted based on the signal of the detecting pin PIN0 of the integrated circuit IC.

In the first period T1, the detection pin PIN0 of the integrated circuit IC detects the first power supply potential PVDD of the $1^{st}$ row of display pixels PX, and thereby the third pin PIN3 of the integrated circuit IC adjusts the data potential DATA of the $1^{st}$ row of display pixels PX; in the second period T2, the detection pin PIN0 of the integrated circuit IC detects the first power supply potential PVDD of the $2^{nd}$ row of display pixels PX, and thereby the third pin PIN3 of the integrated circuit IC adjusts the data potential DATA of the $2^{nd}$ row of display pixels PX; in the $M^{th}$ period TM, the detection pin PIN0 of the integrated circuit IC detects the first power supply potential PVDD of the $M^{th}$ row of display pixels PX, and thereby the third pin PIN3 of the integrated circuit IC adjusts the data potential DATA of the $M^{th}$ row of display pixels PX; and so on.

In an embodiment, within any one frame, the detection pin PIN0 of the integrated circuit IC sequentially obtains the respective first power supply potentials PVDD of the $1^{st}$ to $M^{th}$ rows of display pixels PX. Then, the third pin PIN3 of the integrated circuit IC sequentially adjusts the respective data potentials DATA of the $1^{st}$ to $M^{th}$ rows of display pixels PX. In this way, a difference between the first power supply potential PVDD and the data potential DATA for any two rows of display pixels PX is substantially the same. The driving current ID of the third transistor M13 for any two rows of display pixels PX is substantially the same. Therefore, the M rows of display pixels PX in the display panel 1 can have uniform display brightness after compensation.

In another embodiment, within any one frame, the detection pin PIN0 of the integrated circuit IC sequentially obtains the respective first power supply potentials PVDD of the $M^{th}$ to $1^{st}$ rows of display pixels PX. Then, the third pin PIN3 of the integrated circuit IC sequentially adjusts the respective data potentials DATA of the $M^{th}$ to $1^{st}$ rows of display pixels PX. In this way, a difference between the first power supply potential PVDD and the data potential DATA for any two rows of display pixels PX is substantially the same. The driving current ID of the third transistors M13 for any two rows of display pixels PX is substantially the same. Therefore, the M rows of display pixels PX in the display panel 1 can have uniform display brightness after compensation.

Figure 9:
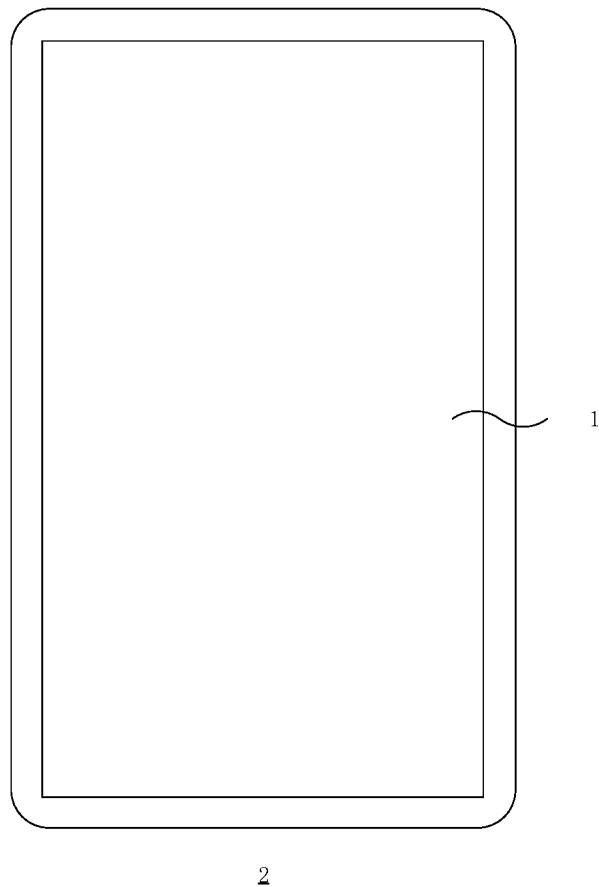
FIG. 9 is a schematic diagram of a structure of a display device according to an embodiment of the present disclosure.

FIG. 9 is a schematic diagram of a structure of a display device according to an embodiment of the present disclosure.

As shown in FIG. 9, the display device 2 includes a display panel 1.

The display device 2 herein uses the display panel 1 for achieving display, and can be e.g., a smart phone or a similar device. The display panel 1 is as described above and will not be further described.

Figure 10:
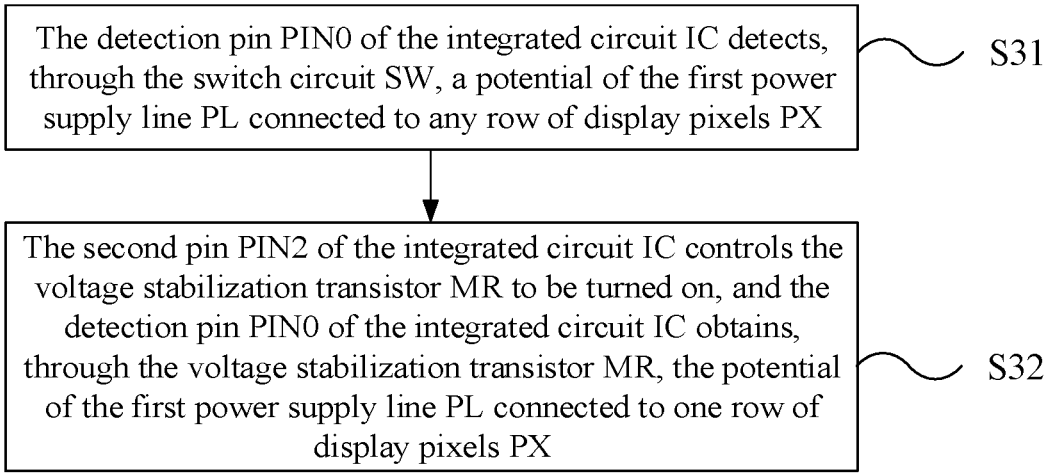
FIG. 10 is a schematic flowchart of a detection compensation method of a display panel according to an embodiment of the present disclosure.

FIG. 10 is a schematic flowchart of a detection compensation method of a display panel according to an embodiment of the present disclosure. FIG. 11 is a schematic time sequence diagram of a detection compensation method of a display panel according to an embodiment of the present disclosure.

As shown in FIG. 1, FIG. 10, and FIG. 11, the display panel 1 has a display area AA and a border area NA. The display area AA is provided with display pixels PX arranged in M rows and N columns, and first power supply lines PL. Here, both M and N are positive integers. The border area NA is provided with the integrated circuit IC, the switch circuit SW and the voltage stabilization transistor MR. One column of display pixels PX is electrically connected to one first power supply line PL, and the first power supply line PL is electrically connected to the first pin PIN1 of the integrated circuit IC. The detection pin PIN0 of the integrated circuit IC is electrically connected to the switch circuit SW, and the switch circuit SW is electrically connected to any one row of display pixels PX. The control electrode of the voltage stabilization transistor MR is electrically connected to the second pin PIN2 of the integrated circuit IC, the first electrode of the voltage stabilization transistor MR is electrically connected to the detection pin PIN0 of the integrated circuit IC, and the second electrode of the voltage stabilization transistor MR is electrically connected to one row of display pixels PX. The detection compensation method 3 of the display panel includes a first stage S31 and a second stage S32.

In the first stage S31, the detection pin PIN0 of the integrated circuit IC detects, through the switch circuit SW, a potential of the first power supply line PL connected to any one row of display pixels PX.

In the second stage S32, the second pin PIN2 of the integrated circuit IC controls the voltage stabilization transistor MR to be turned on, and the detection pin PIN0 of the integrated circuit IC obtains, through the voltage stabilization transistor MR, the potential of the first power supply line PL connected to one row of display pixels PX.

The voltage stabilization transistor MR can be a P-type transistor. The turn-on signal of the voltage stabilization transistor MR is at a low level. The first stage S31 is a period within any one frame, and the second stage S32 is a period between two consecutive frames. Within any one frame, the second pin PIN2 of the integrated circuit IC controls the voltage stabilization transistor MR to be turned off. During a period between two consecutive frames, the second pin PIN2 of the integrated circuit IC controls the voltage stabilization transistor MR to be turned on. At this time, the detection pin PIN0 of the integrated circuit IC obtains the first power supply potential PVDD of one row of display pixels PX through the voltage stabilization transistor MR. The first power supply potential PVDD of one row of display pixels PX is approximately equal to or exactly equal to the first power supply potential PVDD of each of the first several rows (for example a $1^{st}$ row) of display pixels PX, or is approximately equal to or exactly equal to the first power supply potential PVDD of each of the last several rows (for example an $M^{th}$ row) of display pixels PX. At the same time, the voltage stabilization transistor MR avoids floating of the detection pin PIN0 of the integrated circuit IC. The first power supply potential PVDD of one row of display pixels PX is larger than the floating potential. During a period between two consecutive frames, the signal of the detection pin PIN0 of the integrated circuit IC is approximately equal to or exactly equal to the first power supply potential PVDD of each of the first several rows (for example the $1^{st}$ row) of display pixels PX, or is approximately equal to or exactly equal to the first power supply potential PVDD of each of the last several rows (for example the $M^{th}$ row) of display pixels PX. At the beginning of the latter frame of two consecutive frames, the detection pin PIN0 of the integrated circuit IC detects, through the switch circuit SW, the first power supply potential PVDD of each of the first several rows (for example the $1^{st}$ row) of display pixels PX, or the first power supply potential PVDD of each of the last several rows (for example the $M^{th}$ row) of display pixels PX. At this time, the signal of the detection pin PIN0 of the integrated circuit IC is immediately turned to be the first power supply potential PVDD of each of the first several rows (for example the $1^{st}$ row) of display pixels PX, or the first power supply potential PVDD of each of the last several rows (for example the $M^{th}$ row) of display pixels PX. At the same time, the integrated circuit IC accurately detects the first power supply potential PVDD of each of the first several rows (for example the $1^{st}$ row) of display pixels PX, or the first power supply potential PVDD of each of the last several rows (for example the $M^{th}$ row) of display pixels PX. Therefore, the voltage stabilization transistor MR can improve the detection accuracy of the integrated circuit IC.

As shown in FIG. 11, the first stage S31 and the second stage S32 are alternatively repeated.

The first stage S31 is a period within any one frame, and the second stage S32 is a period between two consecutive frames. The first stage S31 and the second stage S32 are alternately repeated, and thus steps within any one frame and steps between two consecutive frames are alternately repeated. In this way, the display panel 1 sequentially displays images of a plurality of frames.

FIG. 12 is a schematic flowchart of a detection compensation method of another display panel according to an embodiment of the present disclosure.

As shown in FIG. 3 and FIG. 12, the second electrode of the voltage stabilization transistor MR is electrically connected to the $1^{st}$ row of display pixels PX.

In the first stage S31, the detection pin PIN0 of the integrated circuit IC sequentially detects, through the switch circuit SW, the potentials of the respective first power supply lines PL connected to the $1^{st}$ to $M^{th}$ rows of display pixels PX.

In the second stage S32, the second pin PIN2 of the integrated circuit IC controls the voltage stabilization transistor MR to be turned on, and the detection pin PIN0 of the integrated circuit IC obtains, through the voltage stabilization transistor MR, the potential of the first power supply lines PL connected to the $1^{st}$ row of display pixels PX.

The first stage S31 is a period within any one frame, and the second stage S32 is a period between two consecutive frames. Within any one frame, the $1^{st}$ row of display pixels PX to the $M^{th}$ row of display pixels PX are sequentially driven to emit light. During a period between two consecutive frames, the detection pin PIN0 of the integrated circuit IC obtains the first power supply potential PVDD of the $1^{st}$ row of display pixels PX through the voltage stabilization transistor MR. At this time, the signal of the detection pin PIN0 of the integrated circuit IC is equal to the first power supply potential PVDD of the $1^{st}$ row of display pixels PX. At the beginning of the latter frame of two consecutive frames, the detection pin PIN0 of the integrated circuit IC detects the first power supply potential PVDD of the $1^{st}$ row of display pixels PX through the switch circuit SW. At this time, the signal of the detection pin PIN0 of the integrated circuit IC remains as the first power supply potential PVDD of the $1^{st}$ row of display pixels PX. The signal of the detection pin PIN0 of the integrated circuit IC does not change from the period between two consecutive frames till the beginning of the latter frame of the two consecutive frames. The integrated circuit IC can more accurately detect the first power supply potential PVDD of the $1^{st}$ row of display pixels PX. Therefore, the voltage stabilization transistor MR can further improve the detection accuracy of the integrated circuit IC.

FIG. 13 is a schematic flowchart of a detection compensation method of another display panel according to an embodiment of the present disclosure.

As shown in FIG. 1 and FIG. 13, the second electrode of the voltage stabilization transistor MR is electrically connected to the $M^{th}$ row of display pixels PX.

In the first stage S31, the detection pin PIN0 of the integrated circuit IC sequentially detects, through the switch circuit SW, the potentials of the respective first power supply lines PL connected to the $M^{th}$ to $1^{st}$ rows of display pixels PX.

In the second stage S32, the second pin PIN2 of the integrated circuit IC controls the voltage stabilization transistor MR to be turned on, and the detection pin PIN0 of the integrated circuit IC obtains, through the voltage stabilization transistor MR, the potential of the first power supply line PL connected to the $M^{th}$ row of display pixels PX.

The first stage S31 is a period within any one frame, and the second stage S32 is a period between two consecutive frames. Within any one frame, the $M^{th}$ row of display pixels PX to the $1^{st}$ row of display pixels PX are sequentially driven to emit light. During a period between two consecutive frames, the detection pin PIN0 of the integrated circuit IC obtains the first power supply potential PVDD of the $M^{th}$ row of display pixels PX through the voltage stabilization transistor MR. At this time, the signal of the detection pin PIN0 of the integrated circuit IC is equal to the first power supply potential PVDD of the $M^{th}$ row of display pixels PX. At the beginning of the latter frame of two consecutive frames, the detection pin PIN0 of the integrated circuit IC detects the first power supply potential PVDD of the $M^{th}$ row of display pixels PX through the switch circuit SW. At this time, the signal of the detection pin PIN0 of the integrated circuit IC remains as the first power supply potential PVDD of the $M^{th}$ row of display pixels PX. The signal of the detection pin PIN0 of the integrated circuit IC does not change from the period between two consecutive frames till the beginning of the latter frame of the two consecutive frames. The integrated circuit IC can more accurately detect the first power supply potential PVDD of the $M^{th}$ row of display pixels PX. Therefore, the voltage stabilization transistor MR can further improve the detection accuracy of the integrated circuit IC.

Figure 14:
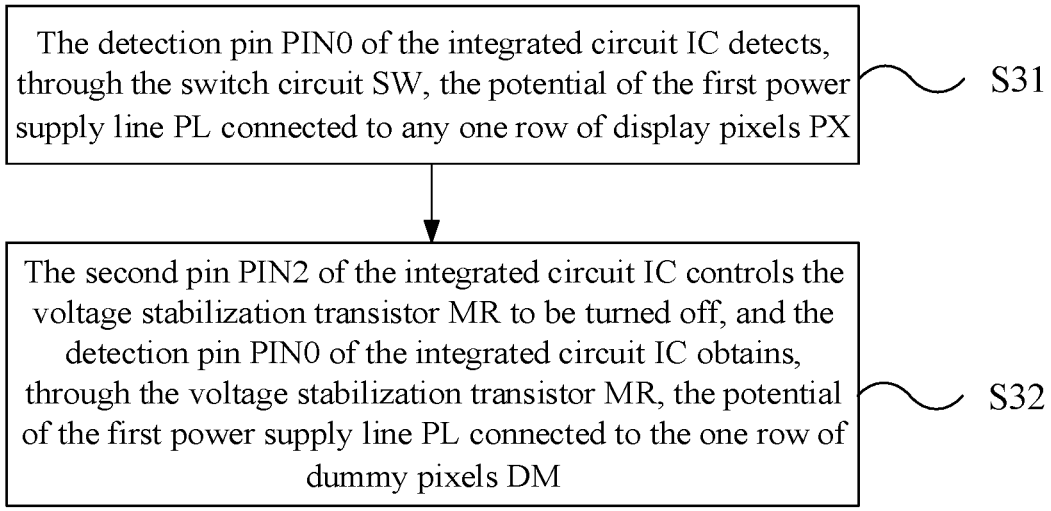
FIG. 14 is a schematic flowchart of a detection compensation method of another display panel according to an embodiment of the present disclosure.
Figure 15:
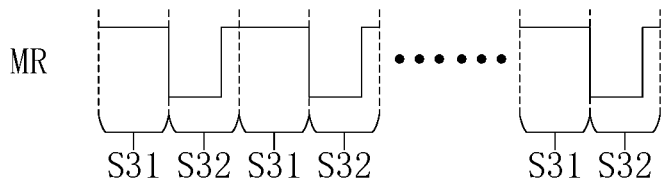
FIG. 15 is a schematic flowchart of a detection compensation method of another display panel according to an embodiment of the present disclosure.

FIG. 14 is a schematic flowchart of a detection compensation method of another display panel according to an embodiment of the present disclosure. FIG. 15 is a schematic flowchart of a detection compensation method of another display panel according to an embodiment of the present disclosure.

As shown in FIG. 5, FIG. 14, and FIG. 15, the display area AA is further provided with one row of dummy pixels DM, and the border area NA is further provided with M scanning circuits SC. The output terminal of the $1^{st}$ scanning circuit SC1 is electrically connected to one row of dummy pixels DM and the $1^{st}$ row of display pixels.

At the end of the second stage S32, the second pin PIN2 of the integrated circuit IC controls the voltage stabilization transistor MR to be turned off, and the detection pin PIN0 of the integrated circuit IC obtains, through the switch circuit SW, the potential of the first power supply line PL connected to the one row of dummy pixels DM.

The output terminal of the $1^{st}$ scanning circuit SC1 is electrically connected to one row of dummy pixels DM and the Pt row of display pixels. The one row of dummy pixels DM are adjacent to the $1^{st}$ row of display pixels. The first stage S31 is within any one frame, and the end of the second stage S32 is an end of a period between two consecutive frames. Within any one frame, the detection pin PIN0 of the integrated circuit IC sequentially detects the respective first power supply potentials PVDD of the $1^{st}$ to $M^{th}$ rows of display pixels PX. At the end of a period between two consecutive frames, the second pin PIN2 of the integrated circuit IC controls the voltage stabilization transistor MR to be turned off. At the same time, the detection pin PIN0 of the integrated circuit IC is electrically connected to one row of dummy pixels DM through a $0^{th}$ switch transistor SWT0 in the switch circuit SW. The detection pin PIN0 of the integrated circuit IC obtains, through the $0^{th}$ switch transistor SWT0 in the switch circuit SW, the potential of the first power supply line PL connected to the one row of dummy pixels DM. The potential of the first power supply line PL connected to the one row of dummy pixels DM is substantially equal to the potential of the first power supply line PL connected to the $1^{st}$ row of display pixels PX. At the beginning of the latter frame of two consecutive frames, the detection pin PIN0 of the integrated circuit IC detects the first power supply potential PVDD of the $1^{st}$ row of display pixels PX through the switch circuit SW. The signal of the detection pin PIN0 of the integrated circuit IC does not change from the end of the period between two consecutive frames till the beginning of the latter frame of the two consecutive frames. The integrated circuit IC can more accurately detect the first power supply potential PVDD of the $1^{st}$ row of display pixels PX. Therefore, the voltage stabilization transistor MR can further improve the detection accuracy of the integrated circuit IC.

Figure 16:
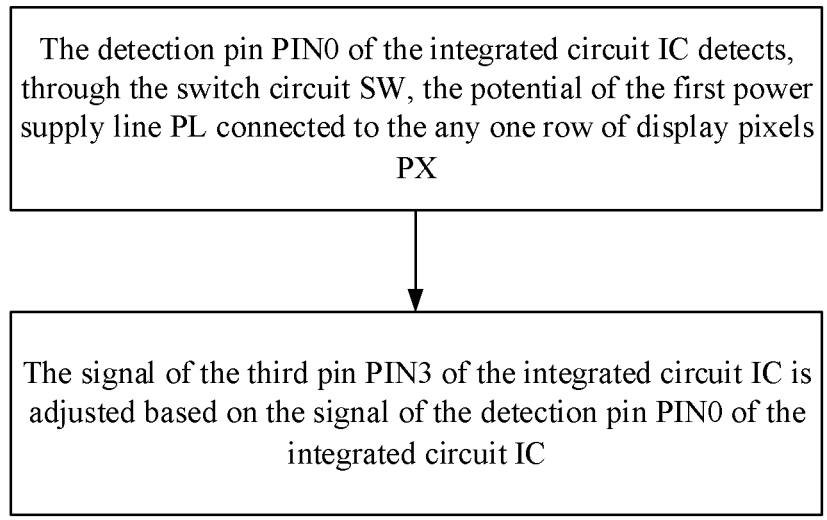
FIG. 16 is a schematic flowchart of a detection compensation method of another display panel according to an embodiment of the present disclosure.

FIG. 16 is a schematic flowchart of a detection compensation method of another display panel according to an embodiment of the present disclosure.

As shown in FIG. 7 and FIG. 16, the display area AA is provided with data lines DL. One data line DL is electrically connected to a respective one column of display pixels PX. The data lines DL are electrically connected to the third pin PIN3 of the integrated circuit IC.

In the first stage S31, the signal of the third pin PIN3 of the integrated circuit IC is adjusted based on the signal of the detection pin PIN0 of the integrated circuit IC.

The first stage S31 is within any one frame. Within any one frame, the detection pin PIN0 of the integrated circuit IC sequentially obtains the respective first power supply potentials PVDD of the $1^{st}$ to $M^{th}$ rows of display pixels PX, or the $M^{th}$ to $1^{st}$ rows of display pixels PX. Then, the third pin PIN3 of the integrated circuit IC sequentially adjusts the respective data potentials DATA of the $1^{st}$ to $M^{th}$ rows of display pixels PX, or the $M^{th}$ to $1^{st}$ rows of display pixels PX. In this way, a difference between the first power supply potential PVDD and the data potential DATA for any two rows of display pixels PX is substantially the same. The driving current ID of the third transistor M13 for any two rows of display pixels PX is substantially the same. Therefore, the M rows of display pixels PX in the display panel 1 can have uniform display brightness after compensation.

In summary, the present disclosure provides a display panel, a display device, and a detection compensation method of a display panel. The display panel has a display area and a border area. The display area is provided with display pixels arranged in M rows and N columns, and the first power supply lines. Here, both M and N are positive integers. The border area is provided with the integrated circuit, the switch circuit, and the voltage stabilization transistor. One column of display pixels are electrically connected to a respective one first power supply line, and the first power supply line is electrically connected to the first pin of the integrated circuit. The detection pin of the integrated circuit is electrically connected to the switch circuit, and the switch circuit is electrically connected to any one row of display pixels. The control electrode of the voltage stabilization transistor is electrically connected to the second pin of the integrated circuit, the first electrode of the voltage stabilization transistor is electrically connected to the detection pin of the integrated circuit, and the second electrode of the voltage stabilization transistor is electrically connected to one row of display pixels. At the beginning of the latter frame of two consecutive frames, the integrated circuit accurately obtains the first power supply potential of each of the first several rows (for example the $1^{st}$ row) of display pixels, or each of the last several rows (for example the $M^{th}$ row) of display pixels. Thereby, the voltage stabilization transistor can improve the detection accuracy of the integrated circuit.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel having a display area and a border area, the display panel comprising:
   display pixels arranged in M rows and N columns and in the display area, where both M and N are both positive integers;
   first power supply lines provided in the display area;
   an integrated circuit provided in the border area, the integrated circuit comprising a first pin, a detection pin and a second pin;
   at least one switch circuit provided in the border area; and
   at least one voltage stabilization transistor provided in the border area,
   wherein one of the M rows is electrically connected to one of the first power supply lines,
   wherein the first power supply lines are electrically connected to the first pin of the integrated circuit, wherein the detection pin of the integrated circuit is electrically connected to the at least one switch circuit, wherein the at least one switch circuit is electrically connected to any one of the M rows of the display pixels, and wherein each voltage stabilization transistor comprises: a control electrode electrically connected to the second pin of the integrated circuit, a first electrode electrically connected to the detection pin of the integrated circuit, and a second electrode electrically connected to one of the M rows of the display pixels.

2. The display panel according to claim 1, wherein the at least one voltage stabilization transistor comprises two voltage stabilization transistors, the control electrode of each of the two voltage stabilization transistors is electrically connected to the second pin of the integrated circuit, and the first electrode of each of the two voltage stabilization transistors is electrically connected to the detection pin of the integrated circuit, the second electrode of one of the two voltage stabilization transistors is electrically connected to a first end of one row of the display pixels, the second electrode of the other one of the two voltage stabilization transistors is electrically connected to a second end of the one row of the display pixels, and the first end is opposite from the second end.

3. The display panel according to claim 1, wherein the second electrode of each voltage stabilization transistor is electrically connected to an $M^{th}$ row of the M rows of the display pixels.

4. The display panel according to claim 1, wherein the second electrode of each voltage stabilization transistor is electrically connected to a $1^{st}$ row of the M rows of the display pixels.

5. The display panel according to claim 1, wherein each switch circuit comprises M switch transistors comprising a $1^{st}$ switch transistor to an $M^{th}$ switch transistor, and
an $X^{th}$ switch transistor of the M switch transistors is electrically connected to the detection pin of the integrated circuit, and is electrically connected to an $X^{th}$ row of the M rows of the display pixels, where X is a positive integer smaller than or equal to M.

6. The display panel according to claim 5, further comprising:
one row of dummy pixels provided in the display area; and
M scanning circuits provided in the border area and comprising a $1^{st}$ scanning circuit to an $M^{th}$ scanning circuit,
wherein the M scanning circuits are electrically connected to the integrated circuit,
wherein an output terminal of the $1^{st}$ scanning circuit is electrically connected to the one row of dummy pixels and a $1^{st}$ row of the M rows of the display pixels,
wherein an output terminal of an $X^{th}$ scanning circuit other than the $1^{st}$ scanning circuit of the M scanning circuits is electrically connected to the $X^{th}$ row of the M rows of the display pixels and a $(X-1)^{th}$ row of the M rows of the display pixels, and
wherein the $X^{th}$ switch transistor comprises a control electrode electrically connected to the output terminal of the $X^{th}$ scanning circuit, a first electrode electrically connected to the detection pin of the integrated circuit, and a second electrode electrically connected to the $X^{th}$ row of the M rows of the display pixels.

7. The display panel according to claim 1, further comprising:
data lines provided in the display area,
wherein one of the data lines is electrically connected to one column of the N columns of the display pixels, and
wherein the data lines are electrically connected to a third pin of the integrated circuit.

8. The display panel according to claim 7, wherein a signal of the third pin of the integrated circuit is adjusted based on a signal of the detection pin of the integrated circuit.

9. The display panel according to claim 1, wherein each of the display pixels comprises a first transistor, a second transistor, a third transistor, a fourth transistor, a fifth transistor, a sixth transistor, a seventh transistor, a storage capacitor, and an organic light-emitting element,
wherein a control electrode of the fifth transistor and a control electrode of the seventh transistor are electrically connected to a first scanning signal;
wherein a first electrode of the fifth transistor is electrically connected to a control electrode of the third transistor;
wherein a first electrode of the seventh transistor is electrically connected to the organic light-emitting element;
wherein a second electrode of the fifth transistor and a second electrode of the seventh transistor are electrically connected to a reference potential;
wherein a control electrode of the second transistor and a control electrode of the fourth transistor are electrically connected to a second scanning signal;
wherein a first electrode of the second transistor is electrically connected to a first electrode of the third transistor, and a second electrode of the second transistor is electrically connected to a data potential;
wherein a first electrode of the fourth transistor is electrically connected to a control electrode of the third transistor, and a second electrode of the fourth transistor is electrically connected to a second electrode of the third transistor;
wherein a control electrode of the first transistor and a control electrode of the sixth transistor are electrically connected to a transmission signal;
wherein a first electrode of the first transistor is electrically connected to the first electrode of the third transistor, and a second electrode of the first transistor is electrically connected to a first power supply potential;
wherein a first electrode of the sixth transistor is electrically connected to the second electrode of the third transistor, and a second electrode of the sixth transistor is electrically connected to the organic light-emitting element; and
wherein a first electrode of the storage capacitor is electrically connected to the control electrode of the third transistor, and a second electrode of the storage capacitor is electrically connected to the first power supply potential.

10. A display device, comprising a display panel having a display area and a border area, the display panel comprising:
display pixels arranged in M rows and N columns in the display area, where both M and N are both positive integers;
first power supply lines provided in the display area;
an integrated circuit provided in the border area, the integrated circuit comprising a first pin, a detection pin and a second pin;
at least one switch circuit provided in the border area; and
at least one voltage stabilization transistor provided in the border area, wherein one of the M rows are electrically connected to one of the first power supply lines, wherein the first power supply lines are electrically connected to the first pin of the integrated circuit, wherein the detection pin of the integrated circuit is electrically connected to the at least one switch circuit, wherein the at least one switch circuit is electrically connected to any one of the M rows of the display pixels, and wherein each voltage stabilization transistor comprises: a control electrode electrically connected to the second pin of the integrated circuit, a first electrode electrically connected to the detection pin of the integrated circuit, and a second electrode electrically connected to one of the M rows of the display pixels.

11. The display device according to claim 10, wherein the at least one voltage stabilization transistor comprises two voltage stabilization transistors, the control electrode of each of the two voltage stabilization transistors is electrically connected to the second pin of the integrated circuit, and the first electrode of each of the two voltage stabilization transistors is electrically connected to the detection pin of the integrated circuit, the second electrode of one of the two voltage stabilization transistors is electrically connected to a first end of one row of the display pixels, the second electrode of the other one of the two voltage stabilization transistors is electrically connected to a second end of the one row of the display pixels, and the first end is opposite from the second end.

12. The display device according to claim 10, wherein the second electrode of each voltage stabilization transistor is electrically connected to an $M^{th}$ row of the M rows of the display pixels.

13. The display device according to claim 10, wherein the second electrode of each voltage stabilization transistor is electrically connected to a $1^{st}$ row of the M rows of the display pixels.

14. The display device according to claim 10, wherein each switch circuit comprises M switch transistors comprising a $1^{st}$ switch transistor to an $M^{th}$ switch transistor, and an $X^{th}$ switch transistor of the M switch transistors is electrically connected to the detection pin of the integrated circuit, and is electrically connected to an $X^{th}$ row of the M rows of the display pixels, where X is a positive integer smaller than or equal to M.

15. A detection compensation method of a display panel, wherein the display panel comprises a display area and a border area, the display panel comprising:

display pixels arranged in M rows and N columns and provided in the display area, where both M and N are both positive integers;

first power supply lines provided in the display area;

an integrated circuit provided in the border area and comprising a first pin, a detection pin and a second pin;

at least one switch circuit provided in the border area; and at least one voltage stabilization transistor provided in the border area, wherein one row of the M rows of the display pixels are electrically connected to one of the first power supply lines, the first power supply lines are electrically connected to the first pin of the integrated circuit, the detection pin of the integrated circuit is electrically connected to the at least one switch circuit, the at least one switch circuit is electrically connected to any one of the M rows of the display pixels, and each of the at least one voltage stabilization transistor comprises: a control electrode electrically connected to the second pin of the integrated circuit, a first electrode electrically connected to the detection pin of the integrated circuit, and a second electrode electrically connected to one of the M rows of the display pixels, and wherein the detection compensation method of the display panel comprises:

in a first stage, sequentially detecting, by the detection pin of the integrated circuit through the at least one switch circuit, a potential of the first power supply lines connected to any one of the M rows of the display pixels; and in a second stage, controlling, by the second pin of the integrated circuit, the at least one voltage stabilization transistor to be turned on; and obtaining, by the detection pin of the integrated circuit through the at least one voltage stabilization transistor, a potential of one of the first power supply lines connected to one of the M rows of the display pixels.

16. The detection compensation method of the display panel according to claim 15, wherein the first stage and the second stage are alternately repeated.

17. The detection compensation method of the display panel according to claim 15, wherein the second electrode of each voltage stabilization transistor is electrically connected to a $1^{st}$ row of the M rows of the display pixels, in the first stage, the detection pin of the integrated circuit sequentially detects, through the at least one switch circuit, the potentials of the respective first power supply lines connected to the $1^{st}$ row to an $M^{th}$ row of the M rows of the display pixels, and in the second stage, the second pin of the integrated circuit controls the at least one voltage stabilization transistor to be turned on, and the detection pin of the integrated circuit obtains, through the at least one voltage stabilization transistor, a potential of one of the first power supply lines connected to the $1^{st}$ row of the M rows of the display pixels.

18. The detection compensation method of the display panel according to claim 15, wherein the second electrode of each voltage stabilization transistor is electrically connected to an $M^{th}$ row of the M rows of the display pixels, in the first stage, the detection pin of the integrated circuit sequentially detects, through the at least one switch circuit, the potentials of the respective first power supply lines connected to the $M^{th}$ row to a $1^{st}$ row of the M rows of the display pixels, and in the second stage, the second pin of the integrated circuit controls the at least one voltage stabilization transistor to be turned on, and the detection pin of the integrated circuit obtains, through the at least one voltage stabilization transistor, the potential of one of the first power supply lines connected to the $M^{th}$ row of the M rows of the display pixels.

19. The detection compensation method of the display panel according to claim 15, wherein the display panel further comprises one row of dummy pixels provided in the display area, and M scanning circuits provided in the border area and comprising a $1^{st}$ scanning circuit to an $M^{th}$ scanning circuit, wherein an output terminal of the $1^{st}$ scanning circuit of the M scanning circuits is electrically connected to the one row of dummy pixels and a $1^{st}$ row of the M rows of the display pixels, and at an end of the second stage, the second pin of the integrated circuit controls the at least one voltage stabilization transistor to be turned off, and the detection pin of the integrated circuit obtains, through the at least one switch circuit, a potential of one of the first power supply lines connected to the one row of dummy pixels.

20. The detection compensation method of the display panel according to claim 15, wherein the display panel further comprises data lines provided in the display area,
one of the data lines is electrically connected to one of the N columns of the display pixels,
the data lines are electrically connected to a third pin of the integrated circuit, and
in the first stage, a signal of the third pin of the integrated circuit is adjusted based on a signal of the detection pin of the integrated circuit.

* * * * *